(12) United States Patent
Coppola et al.

(10) Patent No.: US 11,147,193 B2
(45) Date of Patent: Oct. 12, 2021

(54) VASCULAR COOLING SYSTEM FOR ELECTRICAL CONDUCTORS

(71) Applicant: GM GLOBAL TECHNOLOGY OPERATIONS LLC, Detroit, MI (US)

(72) Inventors: Anthony M. Coppola, Rochester Hills, MI (US); Alireza Fatemi, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 5 days.

(21) Appl. No.: 16/800,625

(22) Filed: Feb. 25, 2020

(65) Prior Publication Data
US 2021/0267097 A1 Aug. 26, 2021

(51) Int. Cl.
*H05K 7/20* (2006.01)
*H01B 9/00* (2006.01)
*B60L 50/64* (2019.01)
*H01R 13/533* (2006.01)
*H01R 43/00* (2006.01)

(52) U.S. Cl.
CPC ........... *H05K 7/20872* (2013.01); *H01B 9/00* (2013.01); *H01R 13/533* (2013.01); *H01R 43/005* (2013.01); *B60L 50/64* (2019.02); *H01R 2201/26* (2013.01)

(58) Field of Classification Search
CPC ...... H05K 7/20872; H01B 9/00; H01B 7/421; H01B 7/423
See application file for complete search history.

(56) References Cited

U.S. PATENT DOCUMENTS

| | | |
|---|---|---|
| 2,990,508 A | 6/1961 | Thompson |
| 5,166,568 A | 11/1992 | Nystuen et al. |
| 5,591,937 A | 1/1997 | Woody et al. |
| 6,163,127 A | 12/2000 | Patel et al. |
| 6,396,241 B1 | 5/2002 | Ramos et al. |
| 6,674,205 B2 | 1/2004 | Biais et al. |

(Continued)

OTHER PUBLICATIONS

Furukawa Electric Group, "Water Cooled Cables for Electric Furnace" Tokyo, Japan (Jul. 2015).

*Primary Examiner* — Hoa C Nguyen
*Assistant Examiner* — Amol H Patel
(74) *Attorney, Agent, or Firm* — Quinn IP Law

(57) ABSTRACT

Presented are electrical conductor assemblies with vascular cooling systems, methods for making/using such assemblies, and vehicles equipped with such assemblies for transmitting power and coolant between electric devices. An electrical conductor assembly includes an outer sheath, an electrical conductor extending through the sheath, a coolant channel defined through the sheath, and an optional cable jacket encasing the electrical conductor. The outer sheath has a tubular body formed from an electrically insulating material. The electrical conductor has a solid cable body located within a conductor duct extending through the sheath. The coolant channel, which is coaxial with and thermally connected to the cable body, passes therethrough coolant fluid that cools the electrical conductor. The cable jacket may be formed from an electrically insulating material having a thermal conductivity and melting point higher than that of the sheath. The conductor assembly may include multiple electrical conductors circumferentially spaced around the coolant channel.

20 Claims, 3 Drawing Sheets

(56) References Cited

U.S. PATENT DOCUMENTS

| | | |
|---|---|---|
| 7,969,058 B2 | 6/2011 | Rahman et al. |
| 8,684,257 B2 | 4/2014 | Osborne et al. |
| 8,928,197 B2 | 1/2015 | Jurkovic et al. |
| 8,933,606 B2 | 1/2015 | Rahman et al. |
| 9,866,092 B2 | 1/2018 | Hanna et al. |
| 2006/0017345 A1 | 1/2006 | Uchida et al. |
| 2007/0216249 A1 | 9/2007 | Gruendel et al. |
| 2009/0045688 A1 | 2/2009 | Liang et al. |
| 2010/0244610 A1 | 9/2010 | Hao et al. |
| 2011/0062902 A1 | 3/2011 | Patel et al. |
| 2011/0109180 A1 | 5/2011 | Akutsu et al. |
| 2011/0169363 A1 | 7/2011 | Summers et al. |
| 2011/0198962 A1 | 8/2011 | Tang |
| 2013/0049516 A1 | 2/2013 | Kleber et al. |
| 2013/0049518 A1 | 2/2013 | Kleber et al. |
| 2013/0127291 A1 | 5/2013 | Agapiou et al. |
| 2013/0147303 A1 | 6/2013 | Kaiser et al. |
| 2013/0270952 A1 | 10/2013 | Jurkovic et al. |
| 2014/0252903 A1 | 9/2014 | Rahman et al. |
| 2019/0168473 A1 | 6/2019 | Ellison et al. |
| 2019/0214161 A1* | 7/2019 | Chen .................... H01R 13/005 |
| 2019/0357386 A1 | 11/2019 | Coppola et al. |
| 2019/0363598 A1 | 11/2019 | Coppola et al. |
| 2020/0317070 A1* | 10/2020 | Fuhrer .................... B60L 53/16 |
| 2020/0361327 A1* | 11/2020 | Heyne .................... H01B 3/305 |

\* cited by examiner

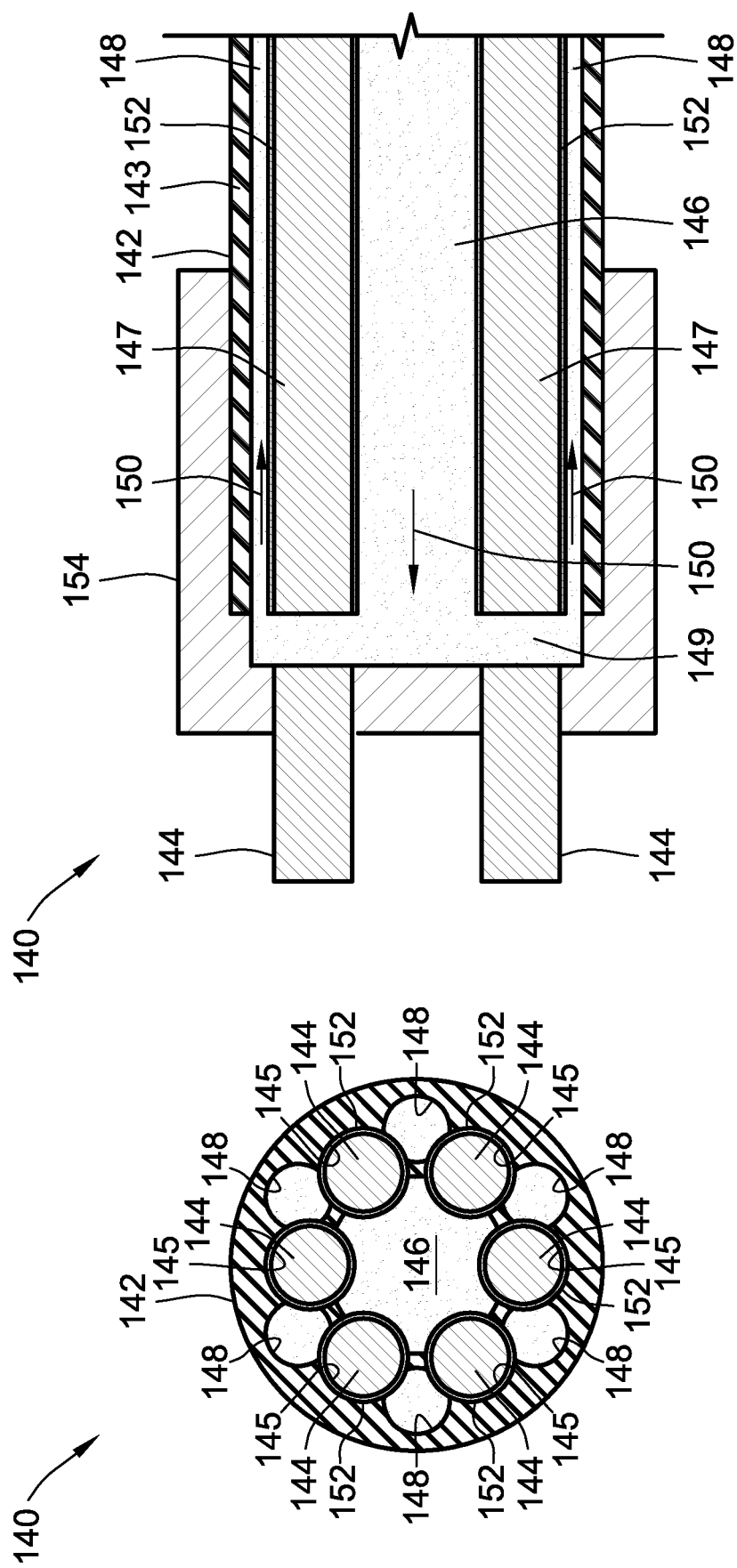

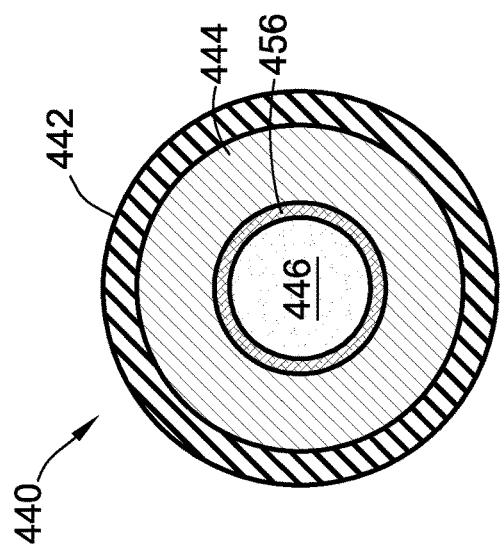
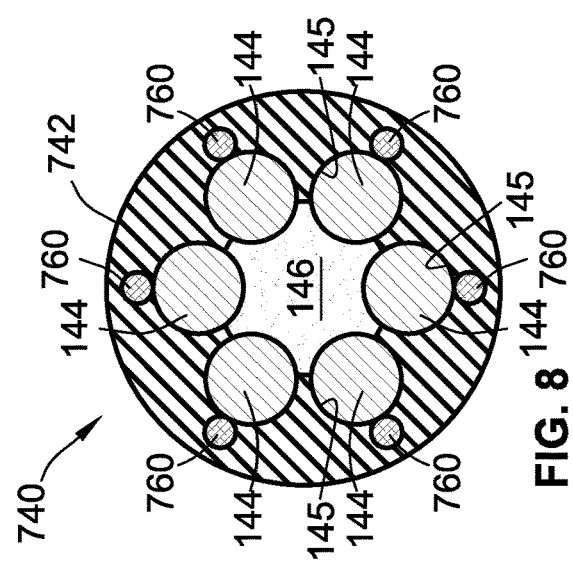
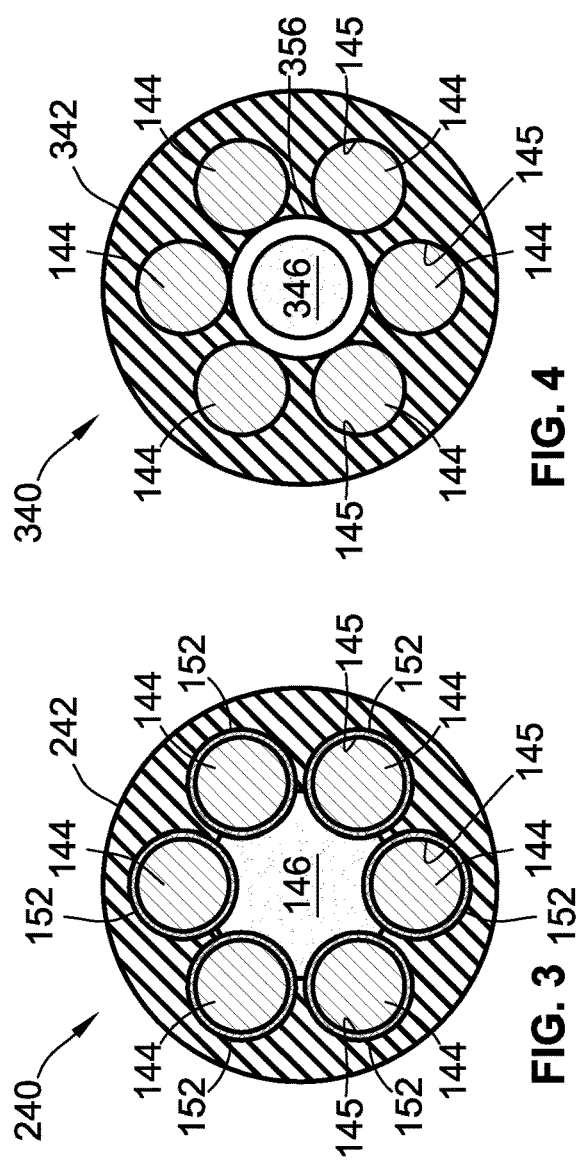
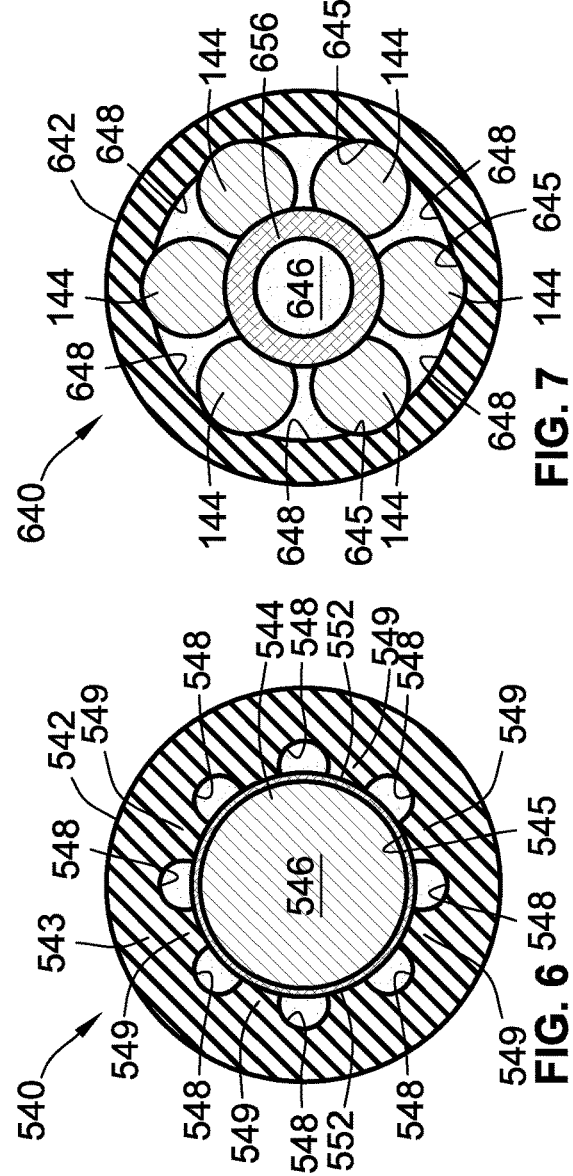

VASCULAR COOLING SYSTEM FOR ELECTRICAL CONDUCTORS

INTRODUCTION

The present disclosure relates generally to electrical conductors for transferring electric power. More specifically, aspects of this disclosure relate to high-voltage electrical cabling for rechargeable energy storage systems of electric-drive vehicles.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving power through an automatic or manually shifted power transmission to the vehicle's final drive system (e.g., differential, axle shafts, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, two, four, and six-stroke architectures, and rotary engines, as some non-limiting examples. Hybrid electric and full electric ("electric-drive") vehicles, on the other hand, utilize alternative power sources to propel the vehicle and, thus, minimize or eliminate reliance on a petroleum-fuel based engine for tractive power.

A full electric vehicle (FEV)—colloquially branded as an "electric car"—is a type of electric-drive vehicle configuration that altogether removes the internal combustion engine and attendant peripheral components from the powertrain system, relying solely on electric traction motors for propulsion and for supporting accessory loads. The engine assembly, fuel supply system, and exhaust system of an ICE-based vehicle are replaced with a single or multiple traction motors, a traction battery back, and battery cooling and charging hardware in an FEV. Hybrid electric vehicle (HEV) powertrains, in contrast, employ multiple sources of tractive power to propel the vehicle, most commonly operating an internal combustion engine assembly in conjunction with a battery-powered or fuel-cell-powered traction motor. Since hybrid-type, electric-drive vehicles are able to derive their power from sources other than the engine, HEV engines may be turned off, in whole or in part, while the vehicle is propelled by the electric motor(s).

High-voltage electrical systems govern the transfer of electricity between the traction motor(s) and a rechargeable traction battery pack (also referred to as "electric-vehicle battery") that stores and supplies the requisite power for operating an electric-drive powertrain. A traction battery pack contains multiple stacks of battery cells that are packaged into individual battery modules and stored inside a battery pack housing. Some vehicular battery systems employ multiple independently operable, high-voltage battery packs to provide higher voltage delivery and greater system capacity through increased amp-hours. The vehicle's electric system may employ a front-end DC-to-DC power converter that is electrically connected to the vehicle's traction battery pack(s) in order to increase the voltage supply to a high-voltage main direct current (DC) bus and an electronic power inverter module (PIM). Operation and control of a multi-phase electric motor, such as permanent magnet synchronous traction motors, may be accomplished by employing the PIM to transform DC electric power to alternating current (AC) power using pulse-width modulated control signals output from a Battery Pack Control Module (BPCM).

During HEV and FEV operation, including wireless and plug-in vehicle charging, heat dissipation within the HV electrical system increases in relation to the square of the electric current being transferred through or to the electric-drive vehicle. As power transfer increases, the amount of heat produced in the power electronics package, electric cables, busbars, and couplers drastically escalates. A plug-in coupler of some commercially available electric vehicle supply equipment (EVSE), for example, may dissipate in excess of 180 watts over a 20 square inch area (e.g., a surface area approximately equivalent to the palm of an adult human hand). In unmanaged situations, such heat flux may lead to unacceptable temperature profiles for the cable and coupler. Previous approaches to offset such heat dissipation through an increase in rate of charge are generally impractical or undesirable due to the concomitant increase in physical size of the electric cabling and interconnected charging hardware. To mitigate heat generation during vehicle operation and charging, a fluid-cooled heat exchange system may be incorporated into the vehicle and/or EVSE for cooling the power electronics, cables, busbars, coupler, etc. An obvious drawback to providing a dedicated cooling system of this nature is the attendant cost, increased weight, and additional packaging space required for the added cooling sump, fan, fluid pumps, hoses, and related hardware.

SUMMARY

Presented herein are electrical conductor assemblies with internal vascular cooling systems, methods for making and methods for using such assemblies, and electric-drive vehicles equipped with such electrical conductor assemblies for transmitting electrical power and coolant fluid to in-vehicle electric devices. By way of example, there are presented sheathed electrical cables with integrated liquid cooling systems capable of transporting liquid coolant and electrical current between components of an electrified propulsion system. A specific, non-limiting application includes inverter bus bar conductors and battery pack charging cables used in high-power electric vehicle charging stations (EVCS) (e.g., rated at 200+kW). The electrical conductor assembly is fabricated with a protective outer sheath formed from an electrically insulative encapsulant, and one or more electrically conductive cables encased inside the outer sheath. Extending longitudinally along the length of the sheath and cables is one or more cooling channels, each of which is axially parallel with and thermally connected to the cables. An optional polymer insulation jacket, with a higher thermal conductivity and melting temperature than the sheath, may be wrapped around and fluidly seal each cable while maintaining maximized thermal transfer.

Attendant benefits for at least some of the disclosed concepts include novel electrical conductor designs with active internal cooling channels that improve conductor cooling and eliminate the need for dedicated coolant piping to cool interconnected electric devices. By providing full-length cable cooling capabilities, the requisite mass of conductive material may be significantly reduced (e.g., 50%+ decrease in copper gauge) while maintaining requisite power capacities (e.g., 150-200 Amps). In automotive applications, disclosed conductor designs markedly reduce packaging space requirements, vehicle size and mass, and system costs for high-power energy storage, conditioning, and transfer systems. Other attendant benefits may include busbar size/mass reduction, decreased part costs, minimized design and assembly costs, and increased vehicle range.

Aspects of this disclosure are directed to electrical conductor designs with internal vascular cooling systems for transmitting electrical power and coolant fluid in high-voltage electrical systems. In an example, there is presented an electrical conductor assembly that is fabricated with an outer sheath having a tubular body formed, in whole or in part, from an electrically insulating material. An electrical conductor with a solid cable body (e.g., one-piece, braided, wound, etc.) is located within an internal conductor duct inside the outer sheath. The cable body extends across the longitudinal length of the tubular sheath body, and may project from one or both ends of the sheath. A coolant channel extends through the tubular sheath body, aligned parallel with and thermally connected to the solid cable body. The coolant channel passes therethrough a coolant fluid and thereby cools the electrical conductor. An optional cable jacket, which may be formed from an electrically insulating material that is distinct from the sheath's material, encases therein the electrical conductor. As yet a further option, the electrical conductor assembly may employ multiple electrical conductors that are circumferentially spaced around the coolant channel. Moreover, the outer sheath may be formed with an array of discrete coolant channels that are circumferentially spaced, for example, around a center coolant channel.

Additional aspects of this disclosure are directed to vehicles equipped with electrical conductor designs having integrated vascular cooling systems for transmitting electrical power and coolant fluid to in-vehicle electric devices. As used herein, the terms "vehicle" and "motor vehicle" may be used interchangeably and synonymously to include any relevant vehicle platform, such as passenger vehicles (ICE, REV, FEV, fuel cell, fully and partially autonomous, etc.), commercial vehicles, industrial vehicles, tracked vehicles, off-road and all-terrain vehicles (ATV), motorcycles, farm equipment, watercraft, aircraft, etc. In an example, a motor vehicle includes a vehicle body with multiple road wheels and other standard original equipment. For electric-drive vehicle applications, one or more electric traction motors operate alone (e.g., for FEV powertrains) or in conjunction with an internal combustion engine assembly (e.g., for HEV powertrains) to selectively drive one or more of the road wheels to thereby propel the vehicle. Also mounted on the vehicle body is one or more rechargeable traction battery packs that selectively store and transmit electric current to power the traction motor(s).

Continuing with the discussion of the above example, the vehicle also includes a high-voltage electrical system, e.g., with a traction power inverter module (TPIM) and main DC bus, that electrically interconnects the traction motor(s) and battery pack(s) via one or more electrical conductor assemblies. Each electrical conductor assembly includes an outer sheath with an elongated tubular body formed from an electrically insulating material and defining therethrough a conductor duct. An electrical conductor having an elongated, solid cable body is located within the conductor duct, extending across the length of the sheath body. An internal coolant channel extends through the tubular sheath body, aligned axially parallel with and thermally connected to the cable body. The coolant channel transmits therethrough a coolant fluid and thereby cools the electrical conductor, traction battery pack, and/or traction motor.

Also presented herein are methods for manufacturing and methods for operating any of the disclosed electric-drive vehicles, high-voltage electrical systems, and/or electrical conductor assemblies. In an example, a method is presented for manufacturing an electrical conductor assembly. This representative method includes, in any order and in any combination with any of the above and below disclosed options and features: receiving an outer sheath having a tubular sheath body formed with a first electrically insulating material and defining therethrough a conductor duct; locating, within the conductor duct, an electrical conductor having a solid cable body extending across a longitudinal length of the tubular sheath body; and forming, in the outer sheath, a coolant channel extending through the sheath body and thermally connected to the solid cable body, the coolant channel being configured to pass therethrough a coolant fluid and thereby cool the electrical conductor. The method may further include encasing the electrical conductor inside a cable jacket that is formed, in whole or in part, with a second electrically insulating material. Locating the electrical conductor inside the outer sheath may include interference fitting the cable jacket, with the electrical conductor encased therein, into the conductor duct. As a further option, the outer sheath may be formed with multiple discrete coolant channels circumferentially spaced around and adjoining the conductor duct. The conductor duct(s) and coolant channel(s) may be formed via deflagration of one or more sacrificial components molded into an extruded polymer substrate.

The above summary does not represent every embodiment or every aspect of this disclosure. Rather, the above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes any and all combinations and subcombinations of the elements and features presented above and below.

BRIEF DESCRIPTION OF THE DRAWINGS

FIGS. 2A and 2B are end-view and side-view schematic illustrations, respectively, of a representative electrical conductor assembly with an internal vascular cooling system for transmitting electric power and cooling fluid in accordance with aspects of the present disclosure.

FIGS. 3 through 8 are end-view schematic illustrations of additional representative electrical conductor assemblies with internal vascular cooling systems in accordance with aspects of the present disclosure.

Figure 1:
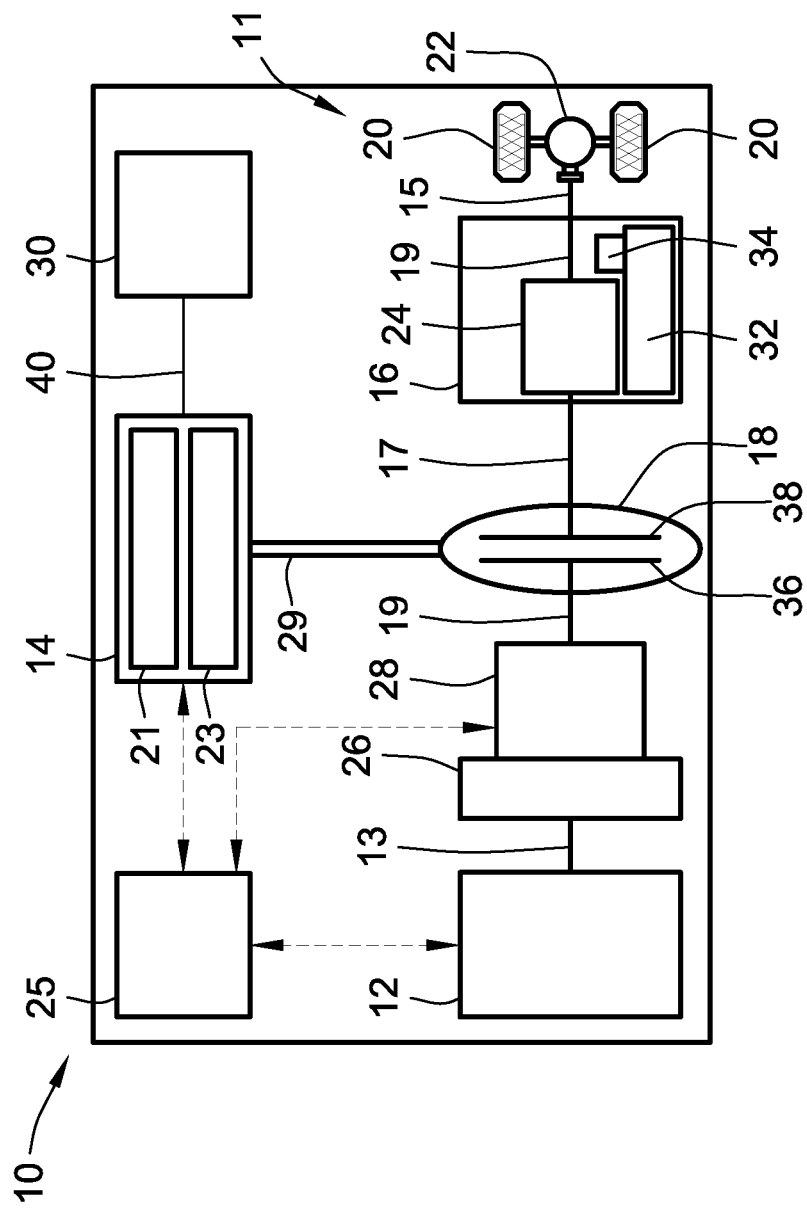
FIG. 1 is schematic illustration of a representative electric-drive motor vehicle with a hybrid powertrain having an electric traction motor connected to a power inverter module and a rechargeable traction battery pack via vascular-cooled electrical cabling in accordance with aspects of the present disclosure.

The present disclosure is amenable to various modifications and alternative forms, and some representative embodiments are shown by way of example in the drawings and will be described in detail below. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for example, by the appended claims.

DETAILED DESCRIPTION

This disclosure is susceptible of embodiment in many different forms. Representative embodiments of the present disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle, when the vehicle is operatively oriented on a horizontal driving surface.

Referring now to the drawings, wherein like reference numbers refer to like features throughout the several views, there is shown in FIG. 1 a schematic illustration of a representative automobile, which is designated generally at 10 and portrayed herein for purposes of discussion as a passenger vehicle with a parallel two-clutch (P2) hybrid-electric powertrain. In particular, the illustrated powertrain is generally composed of a single engine 12 and a single motor 14 that operate, individually and in concert, to transmit tractive power to a multi-speed power transmission 16 through a hydrokinetic torque converter (TC) assembly 18 to drive one or more road wheels 20 of the vehicle's final drive system 11. The illustrated automobile 10—also referred to herein as "motor vehicle" or "vehicle" for short—is merely an exemplary application with which novel aspects and features of this disclosure may be practiced. In the same vein, implementation of the present concepts into an electrified vehicle powertrain should also be appreciated as an exemplary application of the novel concepts disclosed herein. As such, it will be understood that aspects and features of the present disclosure can be applied to other vehicle powertrain architectures, incorporated into any logically relevant type of motor vehicle, and utilized for both automotive and non-automotive applications alike. For instance, disclosed features may be particularly beneficial to FEV powertrains due to the vehicle's more demanding charging requirements. Lastly, only select components have been shown and will be described in additional detail herein. Nevertheless, the vehicles, powertrains, and electrical systems discussed below may include numerous additional and alternative features, and other available peripheral components, for carrying out the various methods and functions of this disclosure.

The representative vehicle powertrain system is shown in FIG. 1 with a prime mover—represented herein by a restartable internal combustion engine (ICE) assembly 12 and an electric motor/generator unit 14—that is drivingly connected to a driveshaft 15 of a final drive system 11 by a multi-speed automatic power transmission 16. The engine 12 transfers power, preferably by way of torque via an engine crankshaft 13 ("engine output member"), to an input side of the transmission 16. According to the illustrated example, the ICE assembly 12 rotates an engine-driven torsional damper assembly 26 and, through the torsional damper assembly 26, an engine disconnect device 28. This engine disconnect device 28, when operatively engaged, transmits torque received from the ICE assembly 12 by way of the damper 26 to input structure of the TC assembly 18. As the name implies, the engine disconnect device 28 may be selectively disengaged to drivingly disconnect the engine 12 from the motor 14 and transmission 16.

The transmission 16, in turn, is adapted to receive, selectively manipulate, and distribute tractive power from the engine 12 and motor 14 to the vehicle's final drive system 11—represented herein by a driveshaft 15, rear differential 22, and a pair of rear road wheels 20—and thereby propel the hybrid vehicle 10. The power transmission 16 and torque converter 18 of FIG. 1 may share a common transmission oil pan or "sump" 32 for supply of hydraulic fluid. A shared transmission pump 34 provides sufficient hydraulic pressure for the fluid to selectively actuate hydraulically activated elements of the transmission 16, TC assembly 18 and, for some implementations, engine disconnect device 28. It may be preferable, for at least some embodiments, that the engine disconnect device 28 comprise an active clutching mechanism, such as a controller-actuated selectable one-way clutch (SOWC) or friction-plate clutch, or a passive clutching mechanism, such as a ratchet-and-pawl or sprag-type freewheel OWC assembly.

The ICE assembly 12 operates to propel the vehicle 10 independently of the electric traction motor 14, e.g., in an "engine-only" operating mode, or in cooperation with the motor 14, e.g., in a "motor-boost" operating mode. In the example depicted in FIG. 1, the ICE assembly 12 may be any available or hereafter developed engine, such as a compression-ignited diesel engine or a spark-ignited gasoline or flex-fuel engine, which is readily adapted to provide its available power output typically at a number of revolutions per minute (RPM). Although not explicitly portrayed in FIG. 1, it should be appreciated that the final drive system 11 may take on any available configuration, including front wheel drive (FWD) layouts, rear wheel drive (RWD) layouts, four-wheel drive (4WD) layouts, all-wheel drive (AWD) layouts, six-by-four (6×4) layouts, etc.

FIG. 1 also depicts an electric motor/generator unit 14 that operatively connects via a motor support hub, shaft, or belt 29 ("motor output member") to torque converter 18, and via torque converter 18 to an input shaft 17 ("transmission input member") of the transmission 16. The motor/generator unit 14 may be directly coupled to a TC input shaft or drivingly mounted to a housing portion of the torque converter 18. The electric motor/generator unit 14 is composed of an annular stator assembly 21 circumscribing and concentric with a cylindrical rotor assembly 23. Electric power is provided to the stator 21 through electrical conductors or cables 40 that pass through the motor housing via suitable sealing and insulating feedthroughs (not illustrated). Conversely, electric power may be provided from the MGU 14 to an onboard traction battery pack 30, e.g., through regenerative braking. Operation of any of the illustrated powertrain components may be governed by an onboard or remote vehicle controller, such as programmable electronic control unit (ECU) 25.

While shown as a P2 hybrid-electric architecture with a single motor in parallel power-flow communication with a single engine assembly, the vehicle 10 may employ other powertrain configurations, including P0, P1, P2.5, P3 and P4 hybrid powertrains, any of which may be adapted for an REV, PHEV, range-extended hybrid vehicle, fuel-cell hybrid vehicle, etc.

Power transmission 16 may use differential gearing 24 to achieve selectively variable torque and speed ratios between transmission input and output shafts 17 and 19, respectively, e.g., while sending all or a fraction of its power through the variable elements. One form of differential gearing is the epicyclic planetary gear arrangement. Planetary gearing offers the advantage of compactness and different torque and speed ratios among all members of the planetary gearing subset. Traditionally, hydraulically actuated torque establishing devices, such as clutches and brakes (the term "clutch" used to reference both clutches and brakes), are selectively engageable to activate the aforementioned gear elements for establishing desired forward and reverse speed ratios between the transmission's input and output shafts 17, 19. While envisioned as an 8-speed automatic transmission, the power transmission 16 may optionally take on other functionally appropriate configurations, including Continuously Variable Transmission (CVT) architectures, automated-manual transmissions, etc.

Hydrokinetic torque converter assembly 18 of FIG. 1 operates as a fluid coupling for operatively connecting the engine 12 and motor 14 with the internal epicyclic gearing 24 of the power transmission 16. Disposed within an internal fluid chamber of the torque converter assembly 18 is a bladed impeller 36 juxtaposed with a bladed turbine 38. The impeller 36 is situated in serial power-flow fluid communication with the turbine 38, with a stator (not shown) interposed between the impeller 36 and turbine 38 to selectively alter fluid flow therebetween. The transfer of torque from the engine and motor output members 13, 29 to the transmission 16 via the TC assembly 18 is through stirring excitation of hydraulic fluid, such as transmission oil, inside the TC's internal fluid chamber caused by rotation of the impeller and turbine blades 36, 38. To protect these components, the torque converter assembly 18 is constructed with a TC pump housing, defined principally by a transmission-side pump shell fixedly attached, e.g., via electron beam welding, MIG or MAG welding, laser welding, and the like, to an engine-side pump cover such that a working hydraulic fluid chamber is formed therebetween.

Turning next to FIGS. 2A and 2B, there is shown an example of an electrical conductor assembly 140 with an integrated "vascular" cooling system for transferring electrical power and coolant fluid to an electric device. By way of non-limiting example, the electrical conductor assembly 140 may be utilized for the HV electrical cables 40 of FIG. 1 to fluidly and electrically connect the electric motor/generator unit 14 with the onboard traction battery pack 30. Integrating coolant fluid conduits into an electrical conductor assembly, coterminous with the electrical cables, provides active cooling of the cables and devices connected thereto, which in turn reduces cable size and eliminates dedicated coolant piping. It is envisioned that the electrical conductor assemblies 140, 240, 340, 440, 540, 640 and 740 illustrated in the appended Figures may be employed in other automotive applications, such as fast-charge EVCS and fuel cell systems, as well as non-automotive applications, such as furnaces, electric utility grids, and photovoltaic (solar) panel systems. While differing in appearance, it is envisioned that the features disclosed with reference to the examples of FIGS. 3-8 may be incorporated, singly or in any combination, into each other and into the examples of FIGS. 2A and 2B, and vice versa.

The electrical conductor assembly 140 of FIGS. 2A and 2B is fabricated with a protective yet flexible exterior casing in the form of an outer sheath 142. The outer sheath 142 acts as an encapsulant with an elongated, tubular sheath body 143 that is formed, in whole or in part, from a (first) electrically insulating material. For instance, the outer sheath 142 may be extruded, molded, cast or formed using any suitable method from nylon and other polyamides, polyvinyl chloride (PVC), polyethylene (PE), polypropylene (PP), polyurethane (PU), epoxy resin and other polyepoxides, neoprene, silicone, ethylene propylene rubber (EPR), polytetrafluoroethylene (PTFE), fluorinated ethylene propylene (FEP), polyvinylidene fluoride (PVDF), thermoplastic elastomers, natural rubber, etc. For at least some applications, the outer sheath 142 is a fiberglass mesh added to a polymer-based insulation or dielectric material. According to the illustrated example, the outer sheath 142 is a single-piece structure with a circular transverse cross-section. It is envisioned, however, that the outer sheath 142 may be a multipart construction and may take on alternative shapes and sizes from that which are shown in the drawings.

Extending along the longitudinal length of the outer sheath 142, on the interior of the tubular sheath body 143, is a circular array of conductor ducts 145 within which are secured a corresponding number of electrical conductors 144. In accord with the illustrated example of FIG. 2A, the electrical conductor assembly 140 is provided with six (6) circular conductor ducts 145 that are equidistantly spaced in a circumferential direction around a central coolant channel 146. In this regard, six (6) discrete circular coolant channels 148 are equidistantly spaced in a circumferential direction around the central coolant channel 146, interleaved with the conductor ducts 145 and, thus, the electrical conductors 144 seated therein. Each conductor duct 145 adjoins and is fluidly exposed to the central coolant channel 146 and a pair of the discrete coolant channels 148. With this arrangement, a suitable coolant fluid (indicated by arrows 150 in FIG. 2B) contacts multiple exposed surfaces of a cable jacket 152 encasing the electrical conductor 144. It may be desirable, for at least some applications, that the conductor ducts 145, central coolant channel 146 and discrete coolant channels 148 extend the entire length of the outer sheath 142 and open at opposing longitudinal ends of the sheath body 143. Alternative electrical conductor architectures may comprise greater or fewer electrical conductors 144, conductor ducts 145 and/or coolant channels 146, 148 than those shown in FIGS. 2A and 2B.

Vascular channel manufacturing in a composite construction, such as the electrical conductor assembly 140, may take on any presently available or hereafter developed technique. For instance, the illustrated coolant channels 146, 148 and, optionally, the conductor ducts 145 may be formed via deflagration of one or more sacrificial components molded into an extruded polymer substrate. As a first step, a meltable or combustible sacrificial component or set of sacrificial components is molded into a polymer or polymer composite substrate. During this molding process, the electrical conductors 144—wrapped inside their respective cable jackets 152—may be extruded or otherwise molded into the polymer substrate. In the example of FIG. 2A, the sacrificial material may be shaped to have a larger contact area with the electrical conductors 144. This may be achieved by wrapping the conductors 144 before the sacrificial material is fully cured, partially melting the sacrificial material to make it deformable, or molding the sacrificial material in this shape. The sacrificial component or components are ignited, causing deflagration of the sacrificial component(s) and thereby forming the channels and ducts. The channels/ducts are thereafter cleaned to remove byproducts of the deflagration of the sacrificial component. Additional information relating to vascular channel manufacture by deflagration may be found in commonly owned U.S. Patent Appl. Pub. No. 2019/0168473 A1, to Ellison et al., which is incorporated herein by reference in its entirety and for all purposes.

Electrical current is transferred in a unilateral or bilateral manner through the outer sheath 142 via the electrical conductors 144. Each electrical conductor 144 has a solid cable body 147, be it a solid one-piece structure, braided construction, or wound composition, that is located within a respective conductor duct 145. Terminal ends of the electrical conductors 144 may protrude from opposing longitudinal ends of the sheath body 143. For simplicity of assembly and ease of manufacture, it may be desirable that all of the electrical conductors 144 share an identical construction, including material composition, method of manufacture, and final geometry. Each electrical conductor 144 may be cut from or wound/braided from a seed wire cut from a supply spool of extruded copper, copper-clad aluminum, or other suitably conductive wire. While shown in FIGS. 2A and 2B as having the same width and cross-sectional geometry, the electrical conductors 144 may take on individual shapes and sizes within the scope of this disclosure.

Coolant fluid 150 is transferred in a unilateral or bilateral manner through the outer sheath 142 via the coolant channels 146, 148. Each coolant channel 146, 148 extends along the longitudinal length of the outer sheath 142, generally coterminous with the ducts 145, on the interior of the tubular sheath body 143. All coolant channels 146, 148 thermally connect to the solid cable body 147 of one or more electrical conductors 144. Heat-mitigating coolant fluid 150, which is pumped through these coolant channels 146, 148, extracts thermal energy from and, thus, cools the electrical conductors 144. As noted above, the central coolant channel 146 extends through the center of the tubular sheath body 143; the circular array of discrete coolant channels 148 circumscribes the central coolant channel 146. As shown, the central coolant channel 146 may operate as a feed line through which coolant fluid 150 is transmitted in a first direction (e.g., to the left in FIG. 2B). Conversely, the circumferentially spaced discrete coolant channels 146 may operate as return lines through which coolant fluid 150 is transmitted in a second direction (e.g., to the right in FIG. 2B). It is also envisioned that the central coolant channel 146 may operate as a return line, the discrete coolant channels 148 operate as feed lines or any combination of channels may be designated as feed or return lines. Alternative arrangements may employ one electrical conductor assembly 140 as a feed line, with all coolant fluid 150 transferred therethrough in one direction, and another conductor assembly 140 as a return line, with all coolant fluid 150 transferred therethrough in the opposite direction. The coolant fluid 150 may take on a variety of different mediums, including purified water, glycols, ethylene glycol, oils, fluorocarbons, and silicones, as some non-limiting examples.

With continuing reference to FIGS. 2A and 2B, each electrical conductor 144 may be wrapped or coated in an optional corrosion-resistant, thermally conductive cable jacket 152 that is formed from an electrically insulating material. For ease of manufacture, the outer sheath 142 and cable jackets 152 may be fabricated from the same polymeric material. Contrarywise, to constrain costs, the outer sheath 142 may be formed from a low-cost electrically insulating polymeric material (e.g., PTFE, PE, PFA, etc.) with a medium thermal conductivity and a low melting point, whereas the cable jackets 152 may be formed from a distinct electrically insulating polymeric material (e.g., silicone, Kevlar, etc.) with a higher thermal conductivity and melting point than that of the sheath 142. To help ensure the integrity of the electrical conductor assembly 140 during normal use thereof, the cable jacket 152, with an electrical conductor 144 encased therein, is interference (friction) fit into one of the conductor ducts 145. Alternative arrangements may use adhesives, welding, crimping or fasteners to immovably attach the electrical conducts 144 to the outer sheath 142. For applications in which the coolant fluid 150 is a dielectric material, the cable jackets 152 may be eliminated from the electrical conductor assembly 140.

Fixed onto a longitudinal end of the outer sheath 142 is a molded connector cap 154 that is designed to securely mount, for example, to a motor housing (e.g., of MGU 14) or other similarly suitable interface such that the electrical conductors 144 properly mate with complementary multi-phase electrical terminals. The feed and return lines, i.e., coolant channels 146, 148, are fluidly joined within a coolant manifold 149 inside the connector cap 154. For implementations in which it is desirable to deliver coolant fluid 150 to the electric device powered via the electrical connector assembly 140, the connector cap 154 may include fluid outlet and inlet ports for transmitting and receiving coolant fluid 150, respectively. Within this connector, the individual conductors 144 may optionally be combined and/or routed to their individual terminal points. After the sheath/cable/coolant channel are assembled during manufacture of the assembly 140, a proximal tip of each cable jacket 152 may be stripped to expose the underlying cable body 147. In the same vein, a proximal tip of the protective outer sheath 142 may be stripped back to better expose the electrical conductors 144 and coolant channels 146, 148. Connector cap 154 may be injection molded from an electrically insulative polymeric material, such as a polyamide, polyolefin, polyepoxide, etc.

With reference next to FIGS. 3-8, wherein like reference numbers refer to similar or the same elements described above, additional examples of electrical conductor assemblies with integrated "vascular' cooling systems are generally designated at 240, 340, 440, 540, 640 and 740. Unless explicitly disclaimed, the elements illustrated in FIGS. 3-8 may include any of the options and alternatives described above with respect to their corresponding elements in FIGS. 2A and 2B. Similar to the electrical conductor assembly 140 of FIGS. 2A and 2B, for example, each electrical conductor assembly 240, 340, 440, 540, 640 and 740 is fabricated with a protective outer sheath 242, 342, 442, 542, 642 and 742, respectively, within which is secured one or more electrical conductors 144, 444 (FIG. 5) and 544 (FIG. 6). In FIGS. 3, 4, 7 and 8, each electrical conductor 144 is nested within a respective conductor duct 145 formed in the elongated tubular body of the outer sheath 242, 342, 642 and 742.

Comparable to the electrical conductor assembly 140 of FIGS. 2A and 2B, electrical conductor assembly 240 of FIG. 3 is also formed with a central coolant channel 146 that extends along the center axis of the sheath's tubular body through the diametric center of the sheath 242. Furthermore, multiple electrical conductors 144 are spaced equidistant from each other in a circumferential direction around the central coolant channel 146. The primary (if not lone) point of demarcation between the electrical conductor assembly 240 and the electrical conductor assembly 140 is that the latter includes the circular array of discrete coolant channels 148 that the former does not. As such, the electrical conductor assembly 240 of FIG. 3 is limited to transferring coolant fluid 150 in one direction at a given time. Moreover, the surface area of each wire 144 and jacket 152 combination of FIG. 3 that is exposed to the coolant fluid 150 is less than that of the exposed surface areas of the wire/jacket combos 144, 152 appearing in FIG. 2A.

Electrical conductor assembly 340 of FIG. 4, like the architectures of FIGS. 2A and 3, includes a circular array of electrical conductors 144 spaced circumferentially around a central coolant channel 346. Unlike the electrical conductor assemblies 140, 240, the electrical conductors 144 in the conductor assembly 340 of FIG. 4 are not encased within cable jackets 152. Rather, fluid separation between the electrical conductors 144 and coolant fluid 150 circulating through the central coolant channel 346 of FIG. 4 is provided predominantly by a thermal coolant pipe 356. This coolant pipe 356, which may be formed from the same electrically insulating materials described above with respect to the cable jackets 152, encases therein and fluidly isolates the central coolant channel 346 from the sheath 342 and conductors 144. Another point of distinction lies in that the central coolant channel 346 of FIG. 4 is narrower than the coolant channels 146 of FIGS. 2A and 3. As another option, the electrical conductors 144 may be braided or wound (e.g., in a helical fashion) around the central coolant channel 346. The insulating coolant pipe 356 may be integrated into the assembly 340 by molding the electrically insulating polymeric material as a protective shell onto a sacrificial material, which is then molded into a polymeric substrate that is fashioned into the center of the sheath 342.

Similar to the designs set forth in FIG. 4, the electrical conductor assembly 440 of FIG. 5 has a lone, central coolant channel 446 that passes through a dedicated coolant pipe 456. Comparatively, the coolant channel 446 and coolant pipe 456 of FIG. 5 have larger diameters than the coolant channel 346 and coolant pipe 356 of FIG. 4, respectively. Unlike the previously described embodiments, the electrical conductor assembly 440 of FIG. 5 is fabricated with a single, solid-body electrical conductor 444 having an annular transverse cross-section with a hollow core. Electrical conductor 444 is concentrically aligned with and circumscribes the coolant channel 446 and coolant pipe 456.

Turning next to FIG. 6, the electrical conductor assembly 540 includes a single conductor duct 545 that is delineated by a single cable jacket 552 and extends through the center of the sheath's hollow tubular body 543. A lone large-diameter electrical conductor 544 wrapped in an oversized cable jacket 552 extends through the diametric center of the sheath 542, retained within the conductor duct 545. Circumferentially spaced around and adjoining the central conductor duct 545 is a series of discrete coolant channels 548. Interleaved between these coolant channels 548 is a spoke-like arrangement of channel walls 549, each of which extends radially inward relative to the tubular sheath body 543. These channel walls 549 physically separate the coolant channels 548 and, at the same time, cooperatively buttress the electrical conductor 544 in the conductor duct 545. In this configuration, the discrete coolant channels 548 may have a round transverse cross-section (as shown), a polygonal transverse cross-section, or another operatively functional cross-section.

FIG. 7 illustrates a representative electrical conductor assembly 640 with a plurality of electrical conductors 144 spaced circumferentially around a central coolant channel 646. Similar to the coolant pipes 356, 456 of FIGS. 4 and 5 described above, a large-gauged thermal coolant pipe 646 encloses therein the coolant channel 646, fluidly separating yet thermally coupling the channel 646 with the conductors 144. In addition, the conductor ducts 645 of FIG. 7 are noticeably shallower than the conductor ducts 145 of FIG. 3. A circular array of discrete coolant channels 648 are circumferentially spaced around the thermal coolant pipe 656, interleaved between the electrical conductors 144. In this example, like that of FIGS. 2A and 2B, the center coolant channel 646 could have coolant flow that is in the opposite direction of the outer discrete coolant channels 648.

The electrical conductor assembly 740 of FIG. 8 may be considered substantially identical to the electrical conductor assembly 240 of FIG. 3 with the exception that the electrical conductors 144 are not wrapped in thermally conductive, polymeric cable jackets 152. As another non-limiting point of demarcation, electrical conductor assembly 740 is also formed with a circular array of communications wires 760 that are located radially outward from the electrical conductors 144, spaced circumferentially around the central coolant channel 147. These communications wires 760 may be reduced gauge (thinner) low voltage electrical conduits that are electrically isolated from the high voltage electrical conductors 144 via sheath 742, and operable to carry electrical signals, e.g., between ECU 25 and MGU 14 of FIG. 1. In this instance, the electrical conductor assembly 740—in addition to being a fully integrated conduit for electrical power and coolant fluid—functions as a data and command signal conduit.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. An electrical conductor assembly, comprising:
   an outer sheath having a tubular sheath body formed with a first electrically insulating material and defining therethrough a conductor duct, the first electrically insulating material including a first polymer with a first thermal conductivity and a first melting point;
   an electrical conductor having a solid cable body located within the conductor duct and extending across a longitudinal length of the tubular sheath body;
   a cable jacket formed with a second electrically insulating material and encasing therein the electrical conductor, the second electrically insulating material including a second polymer with a second thermal conductivity and a second melting point higher than the first thermal conductivity and the first melting point, respectively; and
   a coolant channel extending through the tubular sheath body and thermally connected to the solid cable body, the coolant channel being configured to pass therethrough a coolant fluid and thereby cool the electrical conductor.

2. The electrical conductor assembly of claim 1, wherein the cable jacket, with the electrical conductor encased therein, is interference fit into the conductor duct.

3. The electrical conductor assembly of claim 1, wherein the conductor duct extends through the center of the tubular sheath body, and wherein the coolant channel includes a plurality of coolant channels circumferentially spaced around and adjoining the conductor duct.

4. The electrical conductor assembly of claim 3, wherein the outer sheath includes a plurality of channel walls extending radially inward from the tubular sheath body, separating the coolant channels, and buttressing the electrical conductor in the conductor duct.

5. The electrical conductor assembly of claim 1, wherein the electrical conductor includes a plurality of electrical conductors spaced circumferentially around the coolant channel.

6. The electrical conductor assembly of claim 5, wherein the cable jacket includes a plurality of cable jackets each formed with the second electrically insulating material and encasing therein a respective one of the electrical conductors.

7. The electrical conductor assembly of claim 6, wherein the coolant channel extends through the center of the tubular sheath body, and wherein the conductor duct includes a plurality of discrete conductor ducts each adjoining the coolant channel and securing therein a respective one of the electrical conductors encased within a respective one of the cable jackets.

8. The electrical conductor assembly of claim 7, further comprising a plurality of discrete coolant channels circumferentially spaced around the center coolant channel, interleaved with the electrical conductors, and adjoining the conductor ducts.

9. The electrical conductor assembly of claim 8, wherein the center coolant channel is configured as a feed line through which the coolant fluid is transmitted in a first direction, and the circumferentially spaced discrete coolant channels are configured as return lines through which the coolant fluid is transmitted in a second direction opposite the first direction.

10. The electrical conductor assembly of claim 5, wherein the coolant channel extends through the center of the tubular sheath body, the electrical conductor assembly further comprising a thermal coolant pipe encasing therein the coolant channel.

11. The electrical conductor assembly of claim 10, further comprising a plurality of discrete coolant channels circumferentially spaced around the thermal coolant pipe and interleaved between the electrical conductors.

12. An electric-drive vehicle, comprising:
a vehicle body with a plurality of road wheels attached to the vehicle body;
a traction motor mounted to the vehicle body and configured to drive one or more of the road wheels to thereby propel the vehicle;
a traction battery pack mounted to the vehicle body and configured to exchange an electric current with the traction motor; and
an electrical conductor assembly mounted to the vehicle body and connecting the traction battery pack to the traction motor, the electrical conductor assembly including:
an outer sheath having an elongated tubular sheath body formed from an electrically insulating material and defining therethrough a conductor duct;
an electrical conductor having an elongated solid cable body located within the conductor duct and extending across the length of the tubular sheath body; and
a coolant channel extending through the tubular sheath body axially parallel with and thermally connected to the solid cable body, the coolant channel passing therethrough a coolant fluid and thereby cooling the electrical conductor, traction battery pack and/or traction motor.

13. The electric-drive vehicle of claim 12, further comprising a cable jacket formed with a second electrically insulating material and encasing therein the electrical conductor.

14. The electric-drive vehicle of claim 13, wherein the first electrically insulating material of the outer sheath is a first polymer with a first thermal conductivity and a first melting point, and the second electrically insulating material of the cable jacket is a second polymer with a second thermal conductivity and a second melting point higher than the first thermal conductivity and the first melting point, respectively.

15. A method of manufacturing an electrical conductor assembly, the method comprising:
receiving an outer sheath having a tubular sheath body formed with a first electrically insulating material and defining therethrough a conductor duct, the first electrically insulating material including a first polymer with a first thermal conductivity and a first melting point;
locating, within the conductor duct, an electrical conductor having a solid cable body extending across a longitudinal length of the tubular sheath body;
encasing the electrical conductor within a cable jacket, the cable jacket formed with a second electrically insulating material including a second polymer with a second thermal conductivity and a second melting point higher than the first thermal conductivity and the first melting point, respectively; and
forming, in the outer sheath, a coolant channel extending through the sheath body and thermally connected to the solid cable body, the coolant channel being configured to pass therethrough a coolant fluid and thereby cool the electrical conductor.

16. The method of claim 15, wherein the electrical conductor includes a plurality of electrical conductors, and the cable jacket includes a plurality of cable jackets each formed with the second electrically insulating material and encasing therein a respective one of the electrical conductors.

17. The method of claim 15, wherein locating the electrical conductor within the conductor duct includes interference fitting the cable jacket, with the electrical conductor encased therein, into the conductor duct.

18. The method of claim 15, wherein the conductor duct extends through the center of the tubular sheath body, and wherein the coolant channel includes a plurality of coolant channels circumferentially spaced around and adjoining the conductor duct.

19. The method of claim 15, wherein the electrical conductor includes a plurality of electrical conductors spaced circumferentially around the coolant channel.

20. The method of claim 19, wherein the coolant channel extends through the center of the tubular sheath body, and wherein the conductor duct includes a plurality of discrete conductor ducts each adjoining the coolant channel and securing therein a respective one of the electrical conductors.

* * * * *